(12) United States Patent
Kerger et al.

(10) Patent No.: US 10,429,429 B2
(45) Date of Patent: Oct. 1, 2019

(54) DIFFERENTIAL PROTECTION METHOD, DIFFERENTIAL PROTECTION DEVICE AND DIFFERENTIAL PROTECTION SYSTEM

(71) Applicant: SIEMENS AKTIENGESELLSCHAFT, Munich (DE)

(72) Inventors: Torsten Kerger, Schoenwalde-Glien (DE); Robert Matussek, Berlin (DE)

(73) Assignee: Siemens Aktiengesellschaft, Munich (DE)

( * ) Notice: Subject to any disclaimer, the term of this patent is extended or adjusted under 35 U.S.C. 154(b) by 47 days.

(21) Appl. No.: 15/252,508

(22) Filed: Aug. 31, 2016

(65) Prior Publication Data

US 2017/0059636 A1 Mar. 2, 2017

(30) Foreign Application Priority Data

Aug. 31, 2015 (EP) .................................... 15183104

(51) Int. Cl.
*G01R 31/02* (2006.01)
*H02H 3/30* (2006.01)
(Continued)

(52) U.S. Cl.
CPC ........... *G01R 31/02* (2013.01); *G01R 19/165* (2013.01); *G01R 19/2513* (2013.01); *H02H 3/30* (2013.01);
(Continued)

(58) Field of Classification Search
CPC ...... G01R 19/165; G01R 31/02; G01R 31/08; G01R 31/085; H02H 3/30; H02H 3/302;
(Continued)

(56) References Cited

U.S. PATENT DOCUMENTS

| | | | |
|---|---|---|---|
| 6,571,182 B2 | 5/2003 | Adamiak et al. | |
| 8,154,836 B2 | 4/2012 | Kasztenny et al. | |
| 8,791,730 B2 | 7/2014 | Li et al. | |
| 2005/0049806 A1* | 3/2005 | Premerlani | G01R 19/2513 702/64 |

(Continued)

FOREIGN PATENT DOCUMENTS

EP 2618502 A1 7/2013

*Primary Examiner* — Son T Le
*Assistant Examiner* — Dustin R Dickinson
(74) *Attorney, Agent, or Firm* — Laurence Greenberg; Werner Stemer; Ralph Locher (57) ABSTRACT

In a differential protection method for monitoring a line of a power grid, current indicator measured values are measured at the ends of the line and are transmitted to an evaluation device. A differential current value is formed with current indicator measured values temporally allocated to one another. The time delay between local timers of the measuring devices is used for the temporal allocation of the current indicator measured values measured at different ends. A fault signal indicating a fault affecting the line is generated if the differential current value exceeds a predefined threshold value. A check is carried out using electrical measured quantities temporally allocated to one another and a line-specific parameter to determine whether the time delay information indicates the actual time delay between the respective local timers. A time error signal is generated if erroneous time delay information is detected.

16 Claims, 2 Drawing Sheets

(51) Int. Cl.
*H02H 7/26* (2006.01)
*G01R 19/165* (2006.01)
*H02J 3/00* (2006.01)
*G01R 19/25* (2006.01)
*H02H 1/00* (2006.01)
*H04J 3/06* (2006.01)

(52) U.S. Cl.
CPC ............ *H02H 7/263* (2013.01); *H02J 3/00* (2013.01); *G01R 31/025* (2013.01); *H02H 1/0061* (2013.01); *H04J 3/0667* (2013.01)

(58) Field of Classification Search
CPC .......... H02H 3/305; H02H 3/265; H02H 3/28; H02H 7/263; H02H 7/261; H02H 1/0061; H02J 3/00; H04L 7/0012

See application file for complete search history.

(56) References Cited

U.S. PATENT DOCUMENTS

| | | | |
|---|---|---|---|
| 2010/0191386 A1* | 7/2010 | Sezi | H02H 3/28 700/292 |
| 2010/0202092 A1* | 8/2010 | Gajic | H02H 3/305 361/87 |
| 2011/0069421 A1 | 3/2011 | Marmonier | |
| 2011/0098951 A1* | 4/2011 | Jurisch | H02H 3/305 702/58 |
| 2013/0090875 A1* | 4/2013 | Takeuchi | H02H 3/302 702/72 |
| 2013/0166090 A1* | 6/2013 | Ren | H02J 3/18 700/297 |
| 2013/0181755 A1* | 7/2013 | Li | H02H 3/283 327/156 |
| 2013/0317768 A1* | 11/2013 | Yang | H02H 3/06 702/58 |
| 2014/0036963 A1* | 2/2014 | Dzung | H04B 1/7073 375/141 |
| 2014/0328356 A1 | 11/2014 | Cachin et al. | |

* cited by examiner

DIFFERENTIAL PROTECTION METHOD, DIFFERENTIAL PROTECTION DEVICE AND DIFFERENTIAL PROTECTION SYSTEM

CROSS-REFERENCE TO RELATED APPLICATION

This application claims the priority, under 35 U.S.C. § 119, of European patent application EP 15183104, filed Aug. 31, 2015; the prior application is herewith incorporated by reference in its entirety.

BACKGROUND OF THE INVENTION

Field of the Invention

The invention relates to a differential protection method for monitoring a line of a power grid in which current indicator measured values are measured in each case with measuring devices at the ends of the line, the values indicating the amplitude and phase angle of a phase current flowing at the respective end of the line, wherein the measuring devices have local timers and allocate a time-stamp to the current indicator measured values indicating the time of their measurement, at least the current indicator measured values measured at one end are transmitted via a communication connection to an evaluation device, a differential current value is formed through vectorial addition by means of the evaluation device with current indicator measured values temporally allocated to one another, wherein time delay information indicating the time delay between the local timers of the measuring devices is used for the temporal allocation of the current indicator measured values measured at different ends, and a fault signal indicating a fault affecting the line is generated if the differential current value exceeds a predefined threshold value.

The invention also relates to a corresponding differential protection device to carry out a differential protection method of this type, and a differential protection system with at least two differential protection devices of this type.

A current differential protection method (referred to below for the sake of simplicity as a "differential protection method") is often used to monitor high-voltage and medium-voltage lines, such as overhead lines or cables, of power grids. The current flowing at the ends of the monitored line is measured in the form of current indicator measured values providing information relating to the amplitude and phase angle of the current and is fed to a differential protection device. The differential protection device forms differential current values from the current indicator measured values through vectorial addition, the values being used to evaluate the operational situation of the monitored primary component. To do this, the differential current values are normally determined through vectorial addition and subsequent amount formation from the current indicator measured values. In the fault-free case, the differential current values are in a range close to zero, since, in simplified terms, the current flowing into the component flows completely out of it again. Conversely, if differential current values arise which exceed a non-zero threshold value, these indicate a fault-affected operating condition, e.g. an internal short circuit. In this case, the fault current that is present must be interrupted by opening switching devices, e.g. power switches, which limit the line. For this purpose, the differential protection device generates a corresponding fault signal, as a result of which the generation of a switching signal for the respective switching device can be instigated.

In the case of a line with ends located far apart, for example a line having a length of several kilometers, the current indicator measured values must be transmitted over a longer route. In such a case, a separate differential protection device is normally disposed at each of the ends of the line, forming the respective differential current value from the respective (locally measured) current indicator measured values and the current indicator measured values received from the other end of the line. In the case of a line with a plurality of ends, e.g. a branched line, current indicator measured values are additionally required from each of the ends in order to be able to carry out the differential protection method correctly. To do this, the current indicator measured values measured locally at the respective measuring points must be transmitted between the individual differential protection devices.

Current indicator measured values from at least two different measuring points at the respective ends of the monitored line are consequently required in order to evaluate the operational situation of the line. In the case of existing differential protection systems, the current indicator measured values are frequently transmitted via a hard-wired point-to-point connection (e.g. copper or optical fiber lines), as a result of which a deterministic transmission is achieved, i.e. the transmission time of the measured values is mainly dependent on the transmission route and the transmission type and is also essentially constant.

In more recent differential systems, a tendency has now developed to transmit the current indicator measured values via a communication network, e.g. a telecommunication network or a data communication network based on the IP protocol, rather than via a hard-wired connection. This offers the advantage of a more economical communication infrastructure. Furthermore, communication networks are often already present in the vicinity of primary electrical components, e.g. between substations of a power grid, and can be used without additional costs for the transmission of the current measured values.

However, the advantage of the deterministic transmission time is often lost through the use of communication networks, so that a problem arises in terms of the allocation of the respectively associated current measured values. The local and the received measured values must in fact be temporally aligned in such a way that the indicator measured values measured at the same time are compared in each case with one another in the differential value formation. If, as is possible in a deterministic communication system, for example, the respective transmission time of the current indicator measured values is known, the respective time of the measured value measurement can be determined from the reception time of the measurement data in the local differential protection device and the known transmission time. Conversely, in communication systems which are not deterministic in terms of the transmission paths and/or transit delays of messages, for example telecommunication networks or IP or Ethernet networks, problems arise, for example, because the transmission time is not constant or differences occur in the transmission time in the forward and backward direction.

An over-function of the differential protection device can be caused by such uncertainties in the temporal alignment of the respective current indicator measured values, since a differential current value which specifies a fault relating to the primary component, but which does not actually exist at all, is formed in the addition with the correct algebraic sign of non-associated indicator measured values. This may result in inadvertent tripping responses which impair the correct operation of the power grid.

Since it is thus primarily important for a reliable mode of operation of a differential protection method that the current indicator measured values on the line ends are determined in each case at the same times, the measuring devices with which the current indicator measured values are measured at the line ends now normally have local timers or clocks which emit a time signal which is used for the time stamping of the measured current indicator measured values. In order to be able, for example, to determine the indicator measured values in each case at the same times, it is necessary to time-synchronize these local timers with one another so that the time delay between the local timers is adjusted to zero. This could be achieved, for example, by synchronizing the local timers with one another via an external timer system, e.g. by the time signal contained in the GPS signal. For this purpose, however, special receiving systems, e.g. GPS receivers, are necessary, which increasingly impact on the price of the device. The antennas of GPS receivers furthermore require an unobstructed line of sight to the satellites, so that corresponding structural conditions must prevail or be created.

Without external means such as GPS receivers, a synchronization of the local timers is frequently carried out today using messages transmitted between the measuring devices at the line ends. With this method, also referred to as the "ping-pong method," the transmission and reception timestamps of the transmitted messages are exchanged between the respective measuring devices. The time delay between the local timers is obtained as a result of this method. It is thus possible either to convert the time information of the received measured values of the respective other measuring device contained in the timestamp of the message into their own time, or to adjust the time delay to zero by adjusting the time of one of the timers.

However, a fundamental requirement for this method for determining the time delay between the timers is that the transit delays of the messages must be the same in the transmission on the forward path and the return path. In this connection, this is referred to as the guarantee of symmetrical transit delays.

Communication networks normally guarantee a high data quality, availability and symmetrical transit delays. Nevertheless, it may occur that the requirement for symmetrical transit delays in a communication network cannot be completely met. It has been observed, for example, in the case of a communication route of the transmitted messages passing through a plurality of communication networks or a plurality of subnetworks of a communication network, the transit times may increase gradually in very small amounts and may then in turn suddenly decrease in large jumps. It has furthermore been observed that the symmetry of the transit delays changes when the route of the communication route changes and the originally present transit times do not prevail on the return to the original communication route.

If asymmetrical transit times occur, i.e. the transit times of the messages on the forward path and the return path are not the same, the received current indicator measured values cannot be temporally allocated correctly to their own current indicator measured values. A so-called "angular error" occurs. The respective differential protection device would consequently determine a differential current value which is not present in reality in relation to the monitored line. If this differential current value exceeds a specific threshold value, this results in an inadvertent shutdown of the monitored line.

A differential protection method is known from U.S. Pat. No. 8,154,836 B2 in which, in a differential protection system with more than two ends, the local timers are synchronized via an external synchronization method, e.g. a GPS signal, or a line-based synchronization method. A combined use of the different methods is also possible. If an external time signal fails, it is possible to switch over to the line-based synchronization method under certain conditions so that the timers can continue to be kept synchronous.

SUMMARY OF THE INVENTION

It is accordingly an object of the invention to provide a system which overcomes the above-mentioned and other disadvantages of the heretofore-known devices and methods of this general type and which provides for a most economical possible facility with which a differential protection method can be carried out in the most reliable manner even in the transmission of the current measured values via a communication network in which asymmetrical transit delays may occur.

With the foregoing and other objects in view there is provided, in accordance with the invention, a differential protection method for monitoring a line of a power grid, the method comprising:

measuring current indicator measured values in each case with measuring devices at ends of the line, the measured values indicating an amplitude and a phase angle of a phase current flowing at a respective end of the line, the measuring devices having local timers and allocating a timestamp to the current indicator measured values indicating a time of a measurement thereof;

transmitting the current indicator measured values measured at one end via a communication connection to an evaluation device;

forming a differential current value through vectorial addition in the evaluation device with current indicator measured values temporally allocated to one another, using time delay information indicating a time delay between the local timers of the measuring devices for the temporal allocation of the current indicator measured values measured at different ends of the line;

generating a fault signal indicating a fault affecting the line when the differential current value exceeds a predefined threshold value;

carrying out a check using electrical measured quantities temporally allocated to one another which have been measured at the different ends of the line and a line-specific parameter relating to the line running between the ends in order to determine whether the time delay information indicates an actual time delay between the respective local timers; and when erroneous time delay information is detected in the check, generating a time error signal.

In other words, the objects of the invention are achieved by a method of the aforementioned type in which a check is carried out using electrical measured quantities temporally allocated to one another which have been measured at different ends of the line and a line-specific parameter relating to the line running between the ends to determine whether the time delay information indicates the actual time delay between the respective local timers, and a time error signal is generated if erroneous time delay information is detected in the check.

A primarily important underlying concept of the invention consists in checking the time delay information used for time synchronization purposes which is normally determined continuously during the operation of the line, using electrical measured quantities which have been measured at the line ends and a line-specific parameter which indicates a property of the line located between the ends. If it is established in the check that the time delay information is not plausible, a corresponding message in the form of the time error signal is generated. A property relating to the communication system that is used is advantageously checked using non-communication quantities, i.e. electrical quantities of the monitored line (electrical measured quantities from the line ends and line-specific parameters).

Current indicators, voltage indicators and load flows (product from current and voltage indicators associated with one another) can be used as electrical measured quantities. Line-specific parameters may, for example, be a charging current, a line length and/or a propagation constant.

It can specifically be provided according to the invention that a comparative phase angle is determined in order to check the time delay information using the electrical measured quantities and the line-specific parameter, and the comparative phase angle is used to check the time delay information.

According to this embodiment of the method according to the invention, a comparative phase angle is determined from the information relating to the electrical measured quantities and the line-specific parameter.

To do this, it can be provided according to a further advantageous embodiment of the method according to the invention that the comparative phase angle is determined by extending the electrical measured quantities temporally allocated to one another by the amount of the line-specific parameter and by using the angle located between the extended amplitudes as the comparative phase angle.

For example, according to an advantageous embodiment of the method according to the invention the amplitudes of current indicator measured values temporally allocated to one another may be used as electrical measured quantities which have been measured at different ends of the line, and a charging current value indicating the charging current relating to the line running between the ends is then used as a line-specific parameter. This will be explained in detail below by way of example.

In the fault-free operation of the line, the current flowing into the line corresponds to the sum of the current flowing out of the line and the charging current produced by the capacitance of the line. A comparative phase angle which can be used to check the time delay information must consequently be determined from the amplitudes of the current indicator measured values and the amount of the charging current value through vectorial addition.

The amplitudes of the current indicator measured values which are essentially unaffected by the time delay of the timers are used for the plausibility check and the phase angle information is ignored.

The charging current value is entered by the operator of the power grid comprising the monitored line as the line-specific parameter in the differential protection device. The charging current is dependent on quantities such as the nominal voltage, the length of the line and its capacitive quantity per unit. Specifically, the charging current value can be calculated as follows:

$$I_C = F \cdot U_N \cdot f_N \cdot C_B' \cdot s,$$

where
  $I_C$: is the charging current value to be determined [A];
  $F$: is the factor $$(\frac{2\pi}{\sqrt{3}} \cdot 10^{-6},$$

e.g. $3.63 \cdot 10^{-6}$);
  $U_N$: is the nominal voltage of the power grid [kV];
  $F_N$: is the nominal frequency of the power grid [Hz];
  $C_B'$: is the capacitive quantity per unit of the line [nF/km];
  $s$: is the length of the line [km].

A comparative phase angle is thus determined here from the information relating to the amplitudes of the current indicator measured values that are used and the amount of the charging current value. This is based on the realization that, in the fault-free operation of the line, the current flowing into the line must correspond in the ideal case to the sum of the current flowing out of the line and the charging current produced by the capacitance of the line. A comparative phase angle which can be used to check the time delay information must consequently be determined from the amplitudes of the current indicator measured values and the amount of the charging current value through vectorial addition.

The comparative phase angle is determined here by extending the amplitudes of the current indicator measured values temporally allocated to one another by the amount of the charging current value and by using the angle located between the extended amplitudes as the comparative phase angle.

In graphical terms, a triangle is, in a manner of speaking, constructed, its sides being formed, on the one hand, by the amplitudes of the two current indicator measured values that are used and, on the other hand, by the amount of the charging current value. The angle located between the two amplitudes represents the desired comparative phase angle.

In principle, the method according to the invention therefore operates in this embodiment as shown below. The following physical quantities are required as input quantities:
  amplitude of the current indicator $I_1$ at the line end 1;
  amplitude of the current indicator $I_2$ at the line end 2;
  amount of the charging current $I_C$;
  time delay information from continuous determination.

To do this, the amplitudes of the currents $I_1$ and $I_2$ are measured with the measuring devices at both line ends and are supplied to the differential protection device via the communication connection.

A triangle can be formed in the fault-free operation of the line from the two amplitudes and the amount of the charging current. The absolute phase angle which the current indicators have is irrelevant for this step of the method, and therefore only the amplitude is taken into account. Through the knowledge of the amplitudes, the triangle can be constructed and the angle between the amplitudes can be determined. The resulting angle can then be compared with the time delay from the continuous monitoring of the timers. It can be inferred from any difference that the time delay information is to be regarded as implausible, e.g. due to an asymmetry in relation to the data transmission on the communication channel, and problems with the determination of the differential current value could therefore arise.

As an alternative to the use of current indicator measured values and the charging current value, it can also be provided that voltage indicator measured values temporally allocated to one another are used as electrical measured quantities which have been measured at different ends of the line, and the line length and/or the propagation constant relating to the line running between the ends is used as the line-specific parameter, or that products from current and voltage indicator measured values temporally allocated to one another are used as electrical measured quantities which have been measured at different ends of the line, and the line length and/or the propagation constant relating to the line running between the ends is used as the line-specific parameter.

The time delay information is checked in these cases in principle according to the example already described in detail, in which current indicator measured values and the charging current value are used.

In order to be able to compare the angle information indicated by the comparative phase angle with the time delay information indicating a time, the angle and time must be converted into one another. This conversion can be carried out with the prevailing frequency f of the power grid that is known, e.g. through measurement, via the angular frequency $\omega = 2\pi \cdot f$ known herefrom.

According to a first advantageous embodiment, it can specifically be provided in this connection that a time delay phase angle resulting from the time delay information is determined in order to check the time delay information, the time delay phase angle is compared with the comparative phase angle and, in the event of a deviation between the time delay phase angle and the comparative phase angle, the time error signal is generated.

According to this first embodiment, the time delay information is thus converted into angle information and the comparison is carried out using angles.

According to an alternative advantageous embodiment, it can be provided that comparative time delay information resulting from the comparative phase angle is determined in order to check the time delay information, the comparative time delay information is compared with the time delay information and, in the event of a deviation between the comparative time delay information and the time delay information, the time error signal is generated.

According to this alternative embodiment, the angle information is thus converted into time information and the comparison is carried out using time quantities.

In relation to both alternatives, it can furthermore be provided that the time error signal is generated only if the deviation exceeds a predefined tolerance threshold value.

As a result, particularly for the practical use of the method, the fact that a complete matching of the two angle information elements or time quantities will not normally occur due to inaccuracies in the measurement and calculation can be taken into account. Through suitable selection of a tolerance threshold value, it can be achieved that slight deviations do not result in a generation of the time error signal.

In the event of an inaccurate indication of the time delay information, the correct selection of current indicator measured values associated with one another for the formation of the differential current value can no longer be guaranteed. If the time error signal is present, suitable measures must thus be taken in order to avoid an inadvertent shutdown of the monitored line.

For this purpose, it can be provided according to a first advantageous embodiment of the method according to the invention that the emission of the fault signal is blocked if the time error signal is present.

In this way, the emission of a fault signal and therefore the tripping of switching devices to shut down the line can be completely prevented.

According to one alternative embodiment, it can also be provided in this connection that the value of the threshold value used to evaluate the differential current value is increased if the time error signal occurs.

The sensitivity of the differential protection method can thereby be reduced in a suitable manner in order to compensate for inaccuracies in the determination of the differential current value which are due to the erroneous time delay information by raising the threshold value. According to this embodiment, in the case of particularly high values of the differential current value which are highly probably due to a fault on the line, the line can be shut down despite the presence of the time error signal.

According to a further advantageous embodiment of the method according to the invention, it can be provided that the time delay information is determined in such a way that messages are transmitted via the communication connection and half the value of the time duration of the transmission of a first message in one transmission direction and a second message in the other transmission direction is used to determine the time delay information.

This ping-pong method already mentioned above is particularly well suited in the case of symmetrical communication routes for determining the time delay information, since it can be carried out simply and therefore economically. A suddenly or gradually occurring asymmetry of the communication route, i.e. transit delays of the messages which differ from one another on the forward path and the return path, can easily be determined via the method described above, so that implausible values of the timing delay information can be detected.

However, as an alternative to the ping-pong method, other suitable methods can also be used to determine the time delay information, for example a determination according to the PTP standard IEEE 1588 (Precision Time Protocol).

In order to be able to use the method according to the invention even in the case of lines with more than two ends, for example branched lines, it is finally proposed according to a further advantageous embodiment of the method according to the invention that, in the case of a line having more than two ends, the check to determine whether the time delay information indicates the actual time delay between the respective local timers is carried out in each case for two ends using the charging current value relating to the line section located between these ends.

With the described method and its advantageous embodiments, it is possible to identify and signal the occurrence of an asymmetrical communication route and inaccuracies caused thereby in the determination of the time delay information. The network management of the communication network itself is often not configured for this purpose. One particular advantage consists in that erroneous time delay information can be detected without the use of additional technical devices. Inadvertent tripping of the differential protection, for example, caused by undetected transit delay changes, can be prevented with the described method.

The afore-mentioned object is also achieved by a differential protection device for monitoring a line of a power grid. The differential protection device comprises a measuring device having a local timer which is configured to measure current indicator measured values at one end of the line, the values indicating the amplitude and phase angle of a phase current flowing at the end of the line, and to allocate a timestamp to the current indicator measured values indicating the time of their measurement. The differential protection device furthermore comprises a communication device which is configured to exchange current indicator measured values via a communication route with another differential protection device, and an evaluation device which is configured to form a differential current value with its own current indicator measured values temporally allocated to one another on the one hand, and current indicator measured values received from the other differential protection device on the other hand, through addition with the correct algebraic sign, wherein time delay information indicating the time delay between the local timers of the measuring devices of the differential protection devices is used for the temporal allocation of the current indicator measured values measured at different ends, and to generate a fault signal indicating a fault affecting the line if the differential current value exceeds a predefined threshold value.

It is provided according to the invention that the differential protection device is configured to carry out a check using its own measured quantities temporally allocated to one another on the one hand and measured quantities received from the other differential protection device on the other hand and a line-specific parameter to determine whether the time delay information indicates the actual time delay between the respective local timers, and to generate a time error signal if erroneous time delay information is detected in the check.

Finally, the aforementioned object is also achieved by a differential protection system for monitoring a line of a power grid. The differential protection system comprises at least two differential protection devices, wherein a differential protection device is provided at each end of the line, and a communication connection to which the individual differential protection devices are connected in order to transmit current indicator measured values. Each of the differential protection devices of the differential protection system comprises a measuring device having a local timer which is configured to measure current indicator measured values at a respective end of the line, the values indicating the amplitude and phase angle of a phase current flowing at the end of the line, and to allocate a timestamp to the current measured values indicating the time of their measurement. Each differential protection device furthermore comprises a communication device which is configured to exchange current indicator measured values via a communication route with another differential protection device. At least one of the differential protection devices of the differential protection system furthermore comprises an evaluation device which is configured to form a differential current value with its own current indicator measured values temporally aligned with one another on the one hand and current indicator measured values received from the other differential protection device on the other hand through addition with the correct algebraic sign, wherein time delay information indicating the time delay between the local timers of the measuring devices of the differential protection devices is used for the temporal allocation of the current indicator measured values measured at different ends, and to generate a fault signal indicating a fault affecting the line if the differential current value exceeds a predefined threshold value.

It is provided according to the invention that the at least one of the differential protection devices is configured to carry out a check using its own electrical measured quantities temporally allocated to one another on the one hand and electrical measured quantities received from the other differential protection device on the other hand and a line-specific parameter to determine whether the time delay information indicates the actual time delay between the respective local timers, and to generate a time error signal if erroneous time delay information is detected in the check.

All the details set out above and below in relation to the differential protection method apply to the differential protection device according to the invention and the differential protection system according to the invention and vice versa in a corresponding manner, wherein, in particular, the device according to the invention and the system according to the invention for carrying out the method according to the invention are configured to carry out the method according to the invention in any embodiment or a combination of any embodiments. In respect of the advantages of the device according to the invention, reference is also made to the advantages described in relation to the method according to the invention.

Other features which are considered as characteristic for the invention are set forth in the appended claims.

The invention is explained in detail below with reference to an example embodiment. The specific design of the example embodiment is not to be understood as limiting in any way for the general design of the method according to the invention and the device according to the invention; instead, individual design features of the example embodiment can be freely combined in any manner with one another and with the features described above. Although the invention is illustrated and described herein as embodied in a differential protection method, differential protection device and differential protection system, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
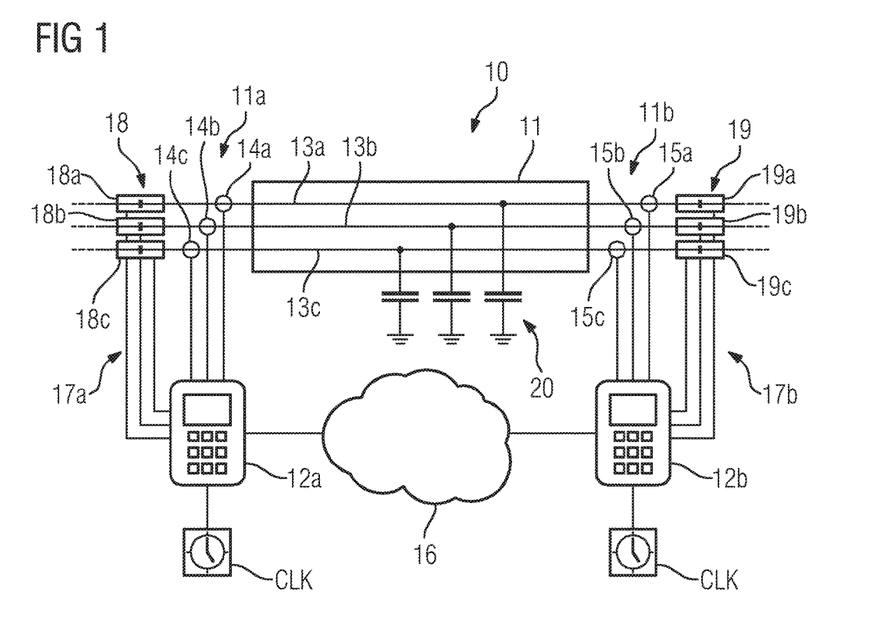
FIG. 1 shows a schematic view of a differential protection system for monitoring a line of a power grid.

Referring now to the figures of the drawing in detail and first, particularly, to FIG. 1 thereof, there is shown a part 10 of a power grid. The latter will not be described in an further detail. The part 10 comprises a three-phase line 11 which may be designed, for example, as an overhead line or as a cable. The line 11 is monitored at its first end 11a by way of a first differential protection device 12a and at its second end 11b by way of a second differential protection device 12b for faults occurring on the line, such as, for example, short circuits. For this purpose, current signals are measured for each phase 13a, 13b, 13c of the line 11 with first current transformers 14a-14c at a first measuring point at the first end 11a of the line 11 and second current transformers 15a-15c at a second measuring point at the second end 11b of the primary component 11. The current measurements are fed to a respective measuring device of the differential protection devices 12a, 12b. Current indicator measured values which provide an indication of the amplitude and phase angle of the current signal at the time of measurement are generated from the analogue current signals. The current indicator measured values, including an A/D conversion, can be generated in the measuring device of the respective differential protection device 12a, 12b, in the current transformers themselves or in a suitable measuring device, e.g. a Phasor Measurement Unit (PMU), a Remote Terminal Unit (RTU) or a Merging Unit. Finally, the generated current indicator measured values are fed to an evaluation device, e.g. a CPU or a signal processor, of the respective differential protection device 12a, 12b.

The differential protection devices 12a and 12b are interconnected by means of a communication connection 16 shown only schematically in FIG. 1, which may be, for example, an IP-based communication network or a telecommunication network. However, any other communication connection of any type can be used to connect the differential protection devices 12a and 12b. The respective differential protection device 12a or 12b can be supplied via this communication connection 16 with the current indicator measured values from the respective other end 11a, 11b of the line 11, i.e. pairs of current indicator measured values recorded at both ends 11a and 11b can be formed in each case in each differential protection device 12a and 12b for each phase 13a, 13b, 13c of the line 11.

Using the current measured values from both ends 11a and 11b of the primary component 11 available in both differential protection devices 12a and 12b, a differential current value can be formed in one or both differential protection devices 12a and 12b by means of the evaluation device through vectorial addition of the current indicator values and subsequent amount formation for each phase, and can be compared with a threshold value.

In the case of a fault-free line 11, the current entering the line 11 for each phase is more or less equal to the current flowing from the line 11, so that an indicator with the amount of around zero should be obtained through vectorial addition of the current indicator measured values. However, due to the charging current on the monitored line, the differential current indicator value virtually never permanently assumes exactly the value zero, even in the fault-free case, but instead lies below a predefined threshold value. In addition, transformer inaccuracies and measurement errors, for example, can also contribute to this effect. The predefined threshold value can be specified as either static or dynamic, for example adapted to the level of the respective phase currents.

The threshold value can be specified as a separate parameter. However, it can also be provided to check whether the threshold value has been exceeded by evaluating the position of a measured value pair consisting of the differential current value and an associated stabilization value in a tripping diagram. For this purpose, differential current values and associated stabilization values are formed from associated, i.e. simultaneously measured, current indicator measured values and the position of the measured value pair consisting of a differential current value and a stabilization value is checked in the tripping diagram. If the measured value pair is located within a tripping range, a fault affecting the monitored line is inferred and the fault signal is generated.

If the differential current value exceeds the predefined threshold value for a specific phase, this indicates a fault affecting the relevant phase of the line 11, which may, for example, be a short circuit to ground or a two-phase or multi-phase short circuit, i.e. a short circuit between two or more phases of the primary component. For the phase in which the fault has been detected, the differential protection devices 12a and 12b generate a fault signal, as a result of which the emission of a tripping signal is effected via control lines 17a, 17b to phase-selectively switchable power switches 18 and 19. The tripping signal causes the corresponding phase-related power switch 18a, 18b, 18c or 19a, 19b, 19c to open its switching contacts, so that the phase 13a, 13b, 13c affected by the fault is disconnected from the remainder of the power grid.

If, for example, a short circuit to ground occurs on the phase 13b, the differential protection devices 12a and 12b detect this on the basis of a differential current value exceeding the respective threshold value and transmit tripping signals to the phase-related power switches 18b and 19b in order to disconnect the phase 13b of the line 11 from the power grid.

Although a three-phase line 11 with only two ends 11a and 11b is shown in FIG. 1, the method according to the invention can also be used with any single-phase or multiphase lines with two or more ends, for example electrical busbars with a plurality of branches.

Furthermore, notwithstanding the representation according to FIG. 1, it can also be provided that the current indicator measured values are transmitted to a single differential protection device and are evaluated there. In this case, it suffices to place measuring devices at the ends 11a, 11b of the line 11 to measure the current indicator measured values and transmit them to the differential protection device. This differential protection device could be disposed at one of the line ends, but also at any other position, for example as a central differential protection device in a switching station or control station.

In order to be able to determine the differential current value correctly, it is necessary that the current indicator measured values used for its formation have actually been simultaneously measured at the ends 11a, 11b of the line 11. However, a time delay normally occurs, particularly in the transmission of the current indicator measured values over a comparatively long communication route, so that the locally measured current indicator measured value cannot readily be linked to a current indicator measured value measured at a distant end and transmitted. If current indicator measured values that have not been simultaneously measured are used, differential current values may occur which exceed the threshold value and would therefore result in the emission of a fault signal, even in a line that is actually fault-free.

For the temporal allocation of the current indicator measured values, the values are therefore normally provided with a marking in the form of a timestamp which indicates the time of their measurement. By selecting the current indicator measured values from different ends of the line which have a matching timestamp, it can be ensured that the differential current value is correctly calculated. However, a prerequisite for this procedure is that the measuring devices used to measure the current indicator measured values in each case have local clocks or timers (CLK) which are synchronized with one another or at least have a known time delay. In order to achieve this, a continuous determination of any time delay between the timers (CLK) of the respective measuring devices takes place which is either used to readjust a timer (CLK) or is used by the evaluation device of the differential protection device for the temporal allocation of the current indicator measured values. In the last-mentioned case, for the temporal allocation of the current indicator measured values, the determined time delay must be subtracted from the timestamp of the current indicator measured value of the measuring device which has the timer with the time that is ahead of the other timer (CLK).

The "ping-pong method", for example, can be used to determine the time delay between the clocks (CLK) of the measuring devices. The time duration which is required to transmit a first message in one direction and then a second message in the other direction via the transmission route between the two measuring devices is measured here. In each case, the transmitted messages have a timestamp which indicates the time of their dispatch. The measuring devices furthermore record the reception time of the respective message. The time duration for the pure transmission of the messages (without any time delays between the reception of the first message and the dispatch of the second message) can be determined by means of the timestamp. The determined time duration is halved and provides the transit delay on the communication route for a message transmitted in one transmission direction. The measuring devices can determine the time delay between the timers (CLK) of the measuring devices by means of the timestamp transmitted with the messages and the reception times and the transit delay which is now known. Further details of the ping-pong method can be found in the aforementioned U.S. Pat. No. 8,154,836 B2.

However, the determination of the time delay can supply reliable results only if the communication route between the measuring devices is symmetrical, i.e. if the transit delays of the messages for the forward path and the return path over the communication route are identical. In the case of an asymmetrical communication route, i.e. non-identical transit delays for the forward path and the return path, the ping-pong method supplies an incorrect transit delay, so that the time delay determined using the transit delay is also erroneous. In this case, current indicator measured values which are not simultaneously measured are erroneously used for the calculation of the differential current indicator value. In the worst case, this can result in the determination of a differential current indicator value which exceeds the threshold value despite an actually fault-free line.

It must therefore be ensured that an immediate detection takes place if a communication route is asymmetrical from the outset or changes, gradually or abruptly, from a symmetrical communication route to an asymmetrical communication route. For example, a previously symmetrical communication route can assume an asymmetrical behavior due to switching operations of switches or routers which modify the communication route of a message. Ageing effects or topology changes can also impact on the behavior of a communication route.

Alternatively, the transit delay can also be determined according to the "Precision Time Protocol" (PTP) defined in the IEEE 1588 standard.

According to the proposed method, the occurrence of an asymmetrical behavior of the communication route or other circumstances distorting the transit delay measurement can be comparatively easily detected. Only electrical quantities and line-specific parameters which are in any case present in a differential protection device as a result of measurement or parameterization are required for this purpose.

It is assumed for the following explanations that the amplitudes of current indicator measured values temporally allocated to one another via the determined time delay are used as electrical measured quantities and a charging current value indicating the charging current of the line between the two measuring devices is used as the line-specific parameter.

The mode of operation of the method is explained in detail with reference to FIG. 2. The detection of the onset of an asymmetrical behavior in relation to the communication route or a different circumstance distorting the transit delay measurement is based on the realization that the current flowing into the line must correspond to the sum of the current flowing out of the line and the charging current caused by the capacitive effect of the line (indicated schematically in FIG. 1 by line capacitors 20). As shown in the equation presented above for determining the charging current value $I_C$, this charging current is dependent, inter alia, on the length of the line is therefore significant, particularly in the case of lines with a length of several kilometers.

A triangle, the angle of which enclosed between the current indicator measured values corresponds to the time delay between the two measuring devices must thus be constructed from current indicator measured values which are actually temporally associated with one another and from the charging current value indicating the charging current.

This can be used to carry out a plausibility check on the time delay which is determined e.g. via the ping-pong method. To do this, only the amplitudes, but not the phase information, of the current indicator measured values $\uparrow_1$ and $\uparrow_2$ assumed to be associated with one another via the time delay which is to be checked are used for this purpose (cf. FIG. 2). These are extended using the amount of the charging current value $I_C$ so that an indicator with a length corresponding to the amount of the charging current value can be positioned between the indicator tips of the two amplitudes $\uparrow_1$ and $\uparrow_2$. This procedure is graphically illustrated in FIG. 2 by drawing a circle 21 with the radius of the amount of the charging current $I_C$ around the indicator tip of the amplitude $\uparrow_2$. The amplitude $\uparrow_1$ is then positioned so that its indicator tip lies on the circumference of the circle. This produces the vectorial sum from a current indicator measured value with the amplitude $\uparrow_1$ and the difference between a current indicator measured value with the amplitude $\uparrow_2$ and the charging current value $I_C$. This procedure, shown here graphically for better understanding, is normally solved numerically.

The angle located between the two amplitudes $\uparrow_1$ and $\uparrow_2$ can be determined from the triangle 22 constructed in this way and can be used as the comparative phase angle $\varphi_V$.

This comparative phase angle $\varphi_V$ is compared with a time delay phase angle $\varphi_Z$ derived from the assumed time delay. This time delay phase angle $\varphi_Z$ can be simply calculated from the time delay information indicating the time delay and the angular frequency specified by the frequency.

If the time delay phase angle $\varphi_Z$ indicates the actual time delay between the timers of the two measuring devices, the values of the time delay phase angle $\varphi_Z$ and the comparative phase angle $\varphi_V$ match one another. In this case, the communication route is symmetrical and the indicator measured values are correctly allocated to one another and can be used to calculate the differential current value. If this lies above the threshold value, an actual fault on the line which requires a shutdown can be assumed.

Figure 2:
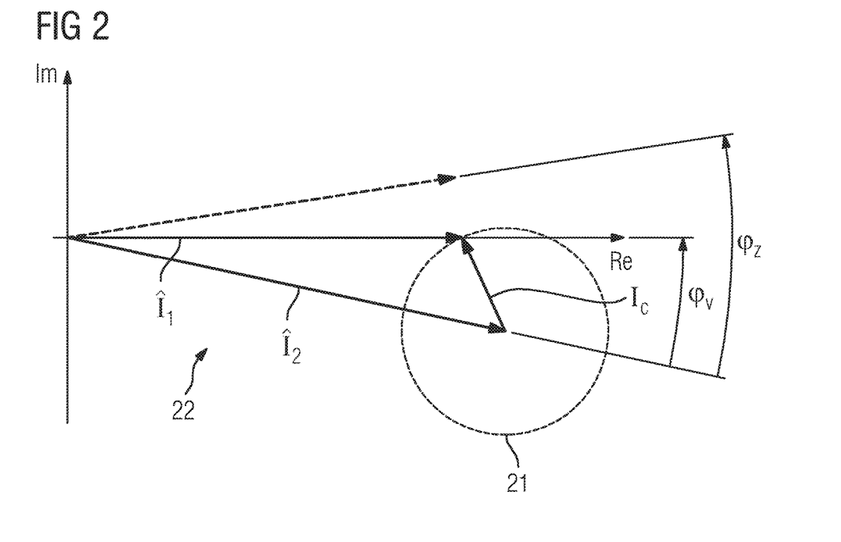
FIG. 2 shows a diagram to explain the determination of a comparative phase angle.

Conversely, if the time delay phase angle $\varphi_Z$ does not indicate the actual time delay between the timers of the two measuring devices, a deviation exists between the values of the time delay phase angle $\varphi_Z$ and the comparative phase angle $\varphi_V$, as shown by way of example in FIG. 2. This means that the determined time delay and the amplitudes $\uparrow_1$, $\uparrow_2$ of the two current indicator measured values do not match one another. It is highly probable that the reason for this is that the transit delay used to determine the time delay could not be correctly defined, e.g. due to an asymmetrical behavior of the communication route.

If a deviation between the time delay phase angle $\varphi_Z$ and the comparative phase angle $\varphi_V$ has been established, the current indicator measured values must not simply be used to determine the differential current value, since the risk otherwise exists that a fault on the line is detected which does not in reality exist at all. If a deviation of this type occurs, a time error signal is therefore generated.

The time error signal can be used, for example, to block the emission of the fault signal indicating a fault on the line. As a result, an unwanted shutdown of the line can be reliably prevented. Alternatively, if the time error signal is present, the threshold value used to evaluate the differential current value can also be increased. Along with an increase in an individual threshold value, this can also be done, for example, through corresponding modification of a characteristic of a limit curve in a tripping diagram. As a result, the sensitivity of the differential protection method is, in a manner of speaking, reduced, and a fault signal is generated only in the event of comparatively high differential current values.

Figure 3:
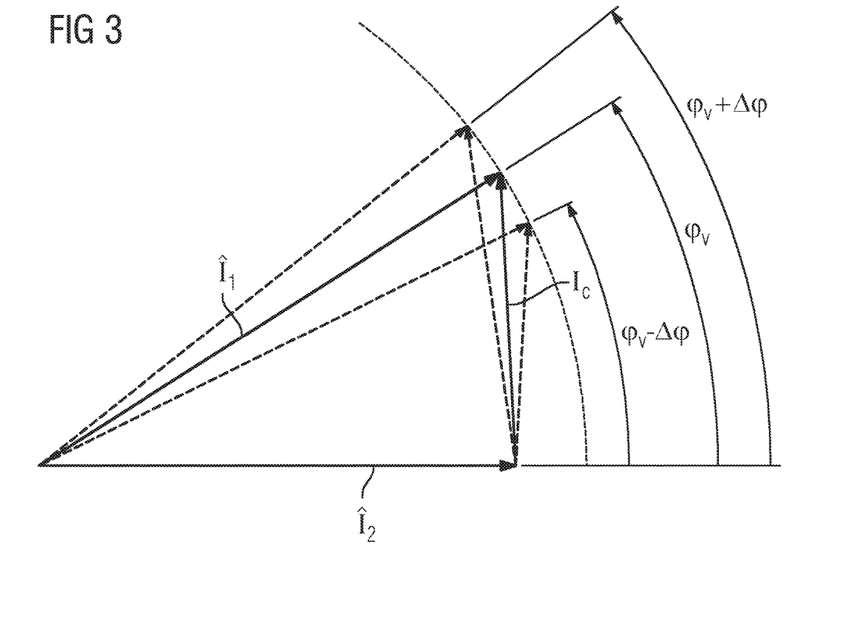
FIG. 3 shows a diagram to explain the use of a tolerance range around the comparative phase angle.

Since further effects such as measurement or calculation inaccuracies in the determination of the current indicator measured values may occur in practice along with possible inaccuracies in the determination of the time delay, any deviation between the time delay phase angle $\varphi_Z$ and the comparative phase angle $\varphi_V$ should be compared with a tolerance threshold value. As a result, the method can be stabilized against minor fluctuations and inaccuracies. This is indicated by way of example in FIG. 3. A tolerance range $\varphi_V \pm \Delta\varphi$ is produced here by broken-line indicators around the value of the comparative phase angle $\varphi_V$ determined in the manner described above. If the time delay phase angle $\varphi_Z$ lies within the tolerance range, the time delay indicated by it is regarded as correct and no time error signal is generated. Conversely, if the time delay phase angle $\varphi_Z$ lies outside the tolerance range, the time error signal is generated.

The details set out above relate to the case where two angular quantities are compared with one another. According to an alternative embodiment, a comparison of two time quantities can also be carried out in a corresponding manner by calculating corresponding comparative time delay information from the comparative phase angle with knowledge of the angular frequency, the information corresponding to the time delay indicated by the comparative phase angle. This comparative time delay information is then compared with the time delay information known, for example, from the ping-pong method and the time error signal is generated if a deviation occurs. The remaining details set out above can be applied accordingly to this embodiment.

The method described can also be applied in the case of a line having more than two ends. In this case, the time delay information check is carried out in each case on the basis of two current indicator measured values of different ends and the charging current relating to the line section located between these ends.

The details set out above can essentially also be transferred to the time information check using other electrical measured quantities (e.g. voltage indicators or load flows as products from current and voltage indicators) and line-specific parameters (line length and/or propagation constant).

Although the invention has been illustrated and described in detail above by means of preferred example embodiments, the invention is not limited by the disclosed examples and other variations may be derived herefrom by the person skilled in the art without exceeding the protective scope of the patent claims set out below.

The invention claimed is:

1. A differential protection method for monitoring a line of a power grid, the method comprising:
    measuring current phasor values in each case with measuring devices at ends of the line, the current phasor values indicating an amplitude and a phase angle of a phase current flowing at a respective end of the line, the measuring devices having local timers and allocating a timestamp to the current phasor values indicating a time of a measurement thereof;
    transmitting at least the current phasor values measured at one end via a communication connection to an evaluation device;
    forming a differential current value through vectorial addition in the evaluation device with current phasor values from the end of the line temporally allocated to one another, using time delay information that is being calculated continuously indicating a time delay between the local timers of the measuring devices for the temporal allocation of the current phasor values measured at different ends of the line;
    generating a fault signal indicating a fault affecting the line when the differential current value exceeds a predefined threshold value;
    carrying out a check using measured electrical quantities temporally allocated to one another which have been measured at the different ends of the line and a line-specific parameter relating to the line running between the ends in order to determine whether the time delay information indicates an actual time delay between the respective local timers, wherein the measured electrical quantities are selected from the group consisting of: amplitudes of current phasor values temporally allocated to one another and voltage phasor values temporally allocated to one another;
    determining a comparative phase angle in order to check the time delay information using the measured electrical quantities and the line-specific parameter, wherein the comparative phase angle is determined by extending the measured electrical quantities temporally allocated to one another by an amount of the line specific parameter and using an angle between extended amplitudes as the comparative phase angle;
    using the comparative phase angle to check the time delay information;
    when erroneous time delay information is detected in the check, generating a time error signal; and
    in response to generating the time error signal, blocking the fault signal and thereby, preventing shutdown of the line.

2. The differential protection method according to claim 1, which comprises:
    determining a time delay phase angle derived from the time delay information in order to check the time delay information;
    comparing the time delay phase angle with the comparative phase angle; and
    generating the time error signal if a deviation occurs between the time delay phase angle and the comparative phase angle.

3. The differential protection method according to claim 1, which comprises:
   determining comparative time delay information derived from the comparative phase angle in order to check the time delay information;
   comparing the comparative time delay information with the time delay information; and
   generating the time error signal if a deviation occurs between the comparative time delay information and the time delay information.

4. The differential protection method according to claim 1, which comprises:
   using the amplitudes of current phasor values temporally allocated to one another as the electrical measured quantities which have been measured at the different ends of the line; and
   using a charging current value indicating a charging current relating to the line running between the ends as the line-specific parameter.

5. The differential protection method according to claim 1, which comprises:
   using the voltage phasor values temporally allocated to one another as the electrical measured quantities which have been measured at the different ends of the line; and
   using a line length and/or a propagation constant relating to the line running between the ends as the line-specific parameter.

6. The differential protection method according to claim 1, which comprises:
   using products of current and voltage phasor values temporally allocated to one another as electrical measured quantities which have been measured at the different ends of the line; and
   using a line length and/or a propagation constant relating to the line running between the ends as the line-specific parameter.

7. The differential protection method according to claim 6, which comprises:
   determining a time delay phase angle derived from the time delay information in order to check the time delay information;
   comparing the time delay phase angle with the comparative phase angle; and
   generating the time error signal if a deviation occurs between the time delay phase angle and the comparative phase angle.

8. The differential protection method according to claim 7, which comprises generating the time error signal only if the deviation exceeds a predefined tolerance threshold value.

9. The differential protection method according to claim 6, which comprises:
   determining comparative time delay information derived from the comparative phase angle in order to check the time delay information;
   comparing the comparative time delay information with the time delay information; and
   generating the time error signal if a deviation occurs between the comparative time delay information and the time delay information.

10. The differential protection method according to claim 9, which comprises generating the time error signal only if the deviation exceeds a predefined tolerance threshold value.

11. The differential protection method according to claim 1, which comprises blocking an emission of the fault signal if the time error signal is present.

12. The differential protection method according to claim 1, which comprises increasing a value of the threshold value used to evaluate the differential current value if the time error signal is generated.

13. The differential protection method according to claim 1, wherein the time delay information is determined by transmitting messages via the communication connection and using one half a value of a time duration of the transmission of a first message in one transmission direction and of a transmission of a second message in the other transmission direction to determine the time delay information.

14. The differential protection method according to claim 1, which comprises, if the line has more than two ends, carrying out the check to determine whether the time delay information indicates the actual time delay between the respective local timers in each case for two given ends using the line-specific parameter relating to the line section between the two given ends.

15. A differential protection device for monitoring a line of a power grid, the device comprising:
   a measuring device having a local timer configured to measure current phasor values at one end of the line, the current phasor values indicating an amplitude and a phase angle of a phase current flowing at the one end of the line, and to allocate a timestamp to the current indicator measured values indicating a time of a measurement thereof;
   a communication device configured to exchange the current measured current phasor values via a communication connection with another differential protection device; and
   an evaluation device configured:
      to form a differential current value with locally measured current phasor values and current phasor values received from the other differential protection device that are temporally allocated to one another through addition with a correct algebraic sign, wherein a continuously calculated time delay information indicating a time delay between the local timers of the measuring devices of the differential protection devices is used for a temporal allocation of the current phasor values measured at different ends, and
      to generate a fault signal indicating a fault affecting the line if the differential current value exceeds a predefined threshold value;
      to carry out a check using locally measured electrical quantities and measured electrical quantities received from the other differential protection device that are temporally allocated to one another together with a line-specific parameter in order to determine whether the time delay information indicates an actual time delay between the respective local timers;
      to determine a comparative phase angle in order to check the time delay information using the measured electrical quantities and the line-specific parameter;
      wherein the comparative phase angle is determined by extending the measured electrical quantities temporally allocated to one another by a amount of the line-specific parameter and using an angle between extended amplitudes as the comparative phase angle;
      to use the comparative phase angle to check the time delay information;
      to generate a time error signal if erroneous time delay information is detected in the check; and to block the fault signal and thereby prevent shutdown of the line in response to generating the time error signal.

16. A differential protection system for monitoring a line of a power grid, the system comprising:
   at least two differential protection devices respectively disposed at a first end of the line and at a second end of the line;
   a communication connection connected between said differential protection devices in order to transmit current phasor values;
   each of said differential protection devices having:
      a measuring device having a local timer configured to measure current phasor values at a respective end of the line, the values indicating an amplitude and a phase angle of a phase current flowing at the end of the line, and to allocate a timestamp to the current phasor values indicating the time of their measurement;
      a communication device configured to exchange current phasor values via the communication connection with the respective other said differential protection device;
   at least one of said differential protection devices having an evaluation device configured:
      to form a differential current value with locally measured current phasor values and current phasor values received from the respectively other said differential protection device that are temporally aligned with one another through addition with a correct algebraic sign, wherein a continuously calculated time delay information indicating a time delay between the local timers of said measuring devices of said differential protection devices is used for a temporal allocation of the current phasor values measured at different ends, and
      to generate a fault signal indicating a fault affecting the line if the differential current value exceeds a predefined threshold value; and
   wherein said at least one of said differential protection devices is configured:
      to carry out a check using locally measured electrical quantities and measured electrical quantities received from the other said differential protection device that are temporally allocated to one another together with a line-specific parameter to determine whether the time delay information indicates an actual time delay between the respective local timers;
      to determine a comparative phase angle in order to check the time delay information using the measured electrical quantities and the line-specific parameter;
   wherein the comparative phase angle is determined by extending the measured electrical quantities temporally allocated to one another by an amount of the line-specific parameter and using an angle between extended amplitudes as the comparative phase angle; and
      to use the comparative phase angle to check the time delay information;
      to generate a time error signal if erroneous time delay information is detected in the check: and
      to block the fault signal and thereby prevent shutdown of the line in response to generating the time error signal.

* * * * *